United States Patent [19]

Ho et al.

[11] 4,005,372
[45] Jan. 25, 1977

[54] FREQUENCY TUNABLE MICROWAVE APPARATUS HAVING A VARIABLE IMPEDANCE HYBRID IDLER CIRCUIT

[75] Inventors: Pang-Ting Ho, Lawrenceville; Arye Rosen, Camden, both of N.J.

[73] Assignee: RCA Corporation, New York, N.Y.

[22] Filed: Jan. 26, 1976

[21] Appl. No.: 652,162

[52] U.S. Cl. .............................. 330/34; 307/88.3; 330/56; 330/61 A; 330/195; 330/188; 331/99; 331/107 R

[51] Int. Cl.² .................................... H03F 3/10

[58] Field of Search ............ 307/88.3; 330/34, 56, 330/61 A; 331/96, 99, 107 R

[56] References Cited
UNITED STATES PATENTS

| 3,882,420 | 5/1975 | Liu | 331/99 |
|---|---|---|---|
| 3,909,740 | 9/1975 | Clorfeine | 330/34 |

Primary Examiner—R. V. Rolinec
Assistant Examiner—Darwin R. Hostetter
Attorney, Agent, or Firm—Edward J. Norton; Joseph D. Lazar; Robert M. Rodrick

[57] ABSTRACT

A frequency tunable microwave apparatus including a semiconductor TRAPATT diode generating a microwave signal at its fundamental, second and third harmonic frequencies. Energy is extracted at the second harmonic frequency and a certain impedance loading is provided at the fundamental frequency and third harmonic by a variable impedance hybrid idler circuit. The hybrid idler circuit comprises a distributed transmission line serially connected to a lumped variable capacitor. Variations in the capacitance of the variable capacitor tune the fundamental frequency without substantially varying the impedance loading conditions of the diode allowing energy to be extracted at the second harmonic frequency throughout the tunable frequency range.

8 Claims, 4 Drawing Figures

FREQUENCY TUNABLE MICROWAVE APPARATUS HAVING A VARIABLE IMPEDANCE HYBRID IDLER CIRCUIT

The Government has rights in this invention pursuant to Contract No. DAAB07-74-C-0180 awarded by the Department of the Army.

BACKGROUND OF THE INVENTION

1. Field of the Invention

This invention relates to a microwave amplifier and more particularly to a broad-band, frequency tunable microwave amplifier having a hybrid idler circuit and a semiconductor diode operating in the TRAPATT mode.

2. Description of the Prior Art

Microwave amplifiers having high power and efficiency and bandwidths greater than 10 percent of the central frequency of operation are desirable, for example, in phased-array radar systems, and communications systems. Prior art amplifiers utilizing TRAPATT diodes have generally required extensive circuit adjustments during fabrication to achieve a broad-band amplifier by making the "instantaneous bandwidths" as wide as possible without sacrificing gain or efficiency. The "instantaneous bandwidth" of these devices as known in this art is the range of input frequencies over which a signal can be amplified at a particular instant of time without any mechanical or electrical adjustments or other tuning.

As is well known, the wave form of a signal generated or amplified by a semiconductor diode operating in the TRAPATT mode is rich in harmonic content. It is generally recognized that a successful TRAPATT amplifier design must provide certain load impedances at the fundamental trapped plasma frequency and at least the second and third harmonic thereof. The impedance loading conditions for such an amplifier are achieved in the prior art typically by using a separate tuned circuit for each harmonically related frequency. For example, each circuit is tuned, i.e. adjusted, to have a desired impedance condition, by placing an inductance element in series with a lumped capacitance element as disclosed in U.S. Pat. No. 3,909,740, issued on Sept. 30, 1975, or by placing tuning stubs in a transmission line as disclosed in U.S. Pat. No. 3,848,196, issued on Nov. 12, 1974. In U.S. Pat. No. 3,868,588, issued on Feb. 25, 1975, one of the tuned circuits is eliminated by providing a semiconductor element which is self-resonant at one of the desired frequencies, thereby precluding the need for one of the tuned circuits.

None of the above-mentioned devices, nor, as far as is known, any other prior art amplifier using TRAPATT diodes, provides for an increase in bandwidth by frequency tuning the device. In order to frequency tune such amplifier devices, the conditions of impedance at each of the harmonic frequencies must be maintained throughout the desired tunable bandwidth. These prior art devices are initially adjusted for a set of impedance conditions, depending upon the preselected frequency at which power is to be extracted, and rely upon a decrease in the Q factor of the circuit to increase the instantaneous bandwidth for broad-band applications. Any adjustment in the impedance condition at the fundamental frequency or any of the related harmonic frequencies requires a readjustment in the other impedance conditions to operate the amplifier. Disadvantageously, therefore, the frequency of such devices is not tunable by simply adjusting the resonant impedance conditions at the fundamental frequency. Such devices would require in addition to a simple resonant impedance adjustment further adjustments in the other circuits.

SUMMARY OF THE INVENTION

According to the present invention, a broad-band, frequency tunable microwave apparatus including a semiconductor diode operating in the TRAPATT mode is provided. The diode, mounted in a transmission line, generates in response to a threshold signal, a microwave signal having fundamental, second and third harmonic frequencies. Energy is extracted at the second harmonic frequency through output means having a substantially resistive impedance. A hybrid idler circuit having a substantially reactive, variable input impedance is connected in parallel with the semiconductor diode to provide certain impedance loading conditions at the fundamental and third harmonic frequencies. The hybrid idler circuit comprises a distributed transmission line serially connected to a lumped variable capacitor which is connected to ground. Variations in the capacitance of the variable capacitor in the idler circuit tune the fundamental frequency and its harmonics without substantially changing the impedance loading conditions at the diode at the tunable fundamental and third harmonic frequencies. The apparatus is thereby tunable and capable of transmitting energy at the second harmonic frequency throughout the tunable frequency range.

DETAILED DESCRIPTION OF THE PREFERRED EMBODIMENT

Figure 1:
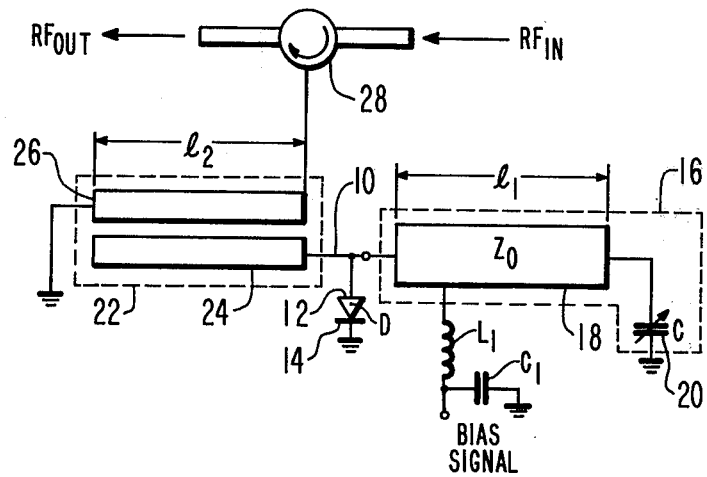
FIG. 1 is a schematic of a microwave amplifier embodying the present invention.

Referring to FIG. 1, there is shown a schematic of a broad-band, frequency tunable microwave apparatus in the preferred embodiment as a TRAPATT amplifier. A semiconductor diode D, constructed to operate in the TRAPATT mode such as described in U.S. Pat. No. 3,600,649, issued on Aug. 17, 1971, is mounted in a transmission line 10. Diode D is connected as by electrodes 12 and 14 between transmission line 10 and ground. By way of illustration, the cathode electrode 14 is connected to ground and the anode electrode 12 is connected to the transmission line 10. Preferably, the diode electrode having the better thermal path is connected to ground. Electrically connected to transmission line 10 and parallel with diode D is a "hybrid" idler circuit, generally designated as 16.

Figure 2:
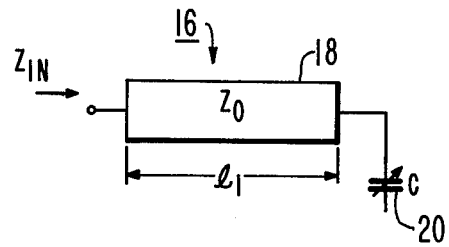
FIG. 2 is a schematic of the hybrid idler circuit portion of the amplifier of FIG. 1.

As shown in detail in FIG. 2, idler circuit 16 comprises a section of a distributed transmission line 18 having a characteristic impedance, $Z_o$, serially connected with a lumped variable capacitor 20, having a capacitance, C. One terminal of variable capacitor 20 is also connected to ground. The length $l_1$ of transmission line 18 is fixed at a selected dimension to obtain the desired impedances at the diode.

As is well known in the art, an idler circuit may be provided in an oscillator or amplifier circuit to determine the operational frequency of the device. It is designated "idler" circuit because it is a circuit comprising largely reactive elements having little or no resistive component. Thus, no significant amount of energy is extracted from the idler circuit when current passes through it, its main function being the determination of the resonant operational frequency.

Heretofore, many of the prior art devices have utilized an open-ended distributed transmission line as the idler circuit having an electrical length equal to $\lambda/4$, where $\lambda$ is the wavelength of a desired operating frequency. Other prior art devices, as previously described, use an inductive element in series with a lumped capacitive element for the idler circuit. Thus, the known idler circuits comprise either an open-ended distributed impedance or a series of lumped impedances but not a combination of lumped and distributed impedance elements.

TRAPATT diodes require that their associated transmission line circuitry be designed, as described above, to support not only the fundamental operating frequency of the device but up to at least the third harmonic frequency as well. Various modifications in circuitry and tuning techniques were introduced, as explained above, to fabricate amplifier or oscillator circuits using TRAPATT diodes by providing appropriate impedance conditions at the fundamental and harmonically related frequencies. For example, a fundamental power extraction TRAPATT amplifier designed to amplify a 3 GHz signal would require a circuit designed to provide for the appropriate impedances at 3 GHz, 6 GHz and 9 GHz. In the present state of the art, amplification of a fundamental 3 GHz signal gives rise to two problems: first, a diode with a relatively thin high resistivity region with correspondingly small design tolerances must be provided in the diode fabrication; and second, the relatively short wavelengths associated with the higher frequencies pose significant problems in circuit design. To overcome these problems many prior art devices have power extracted at the second harmonic frequency. This allows a diode having a lower fundamental frequency of, for example, 1.5 GHz, to provide the second and third harmonic frequencies of 3.0 GHz and 4.5 GHz, respectively. These lower frequencies permit easier fabrication of the circuit and diode.

Even though it is preferable to extract power at the second harmonic frequency, many of the prior art amplifiers are fabricated to permit power extraction at any harmonically related frequency, despite slight losses in efficiency, by presenting the signal generator with the required load impedances. Ideally, these loads are either zero, infinite or purely reactive at the unwanted frequencies and largely resistive at the desired harmonic frequency, thus confining the unwanted harmonic frequency signals to the internal operation of the apparatus, while passing only the desired harmonic to an external load.

Figure 3:
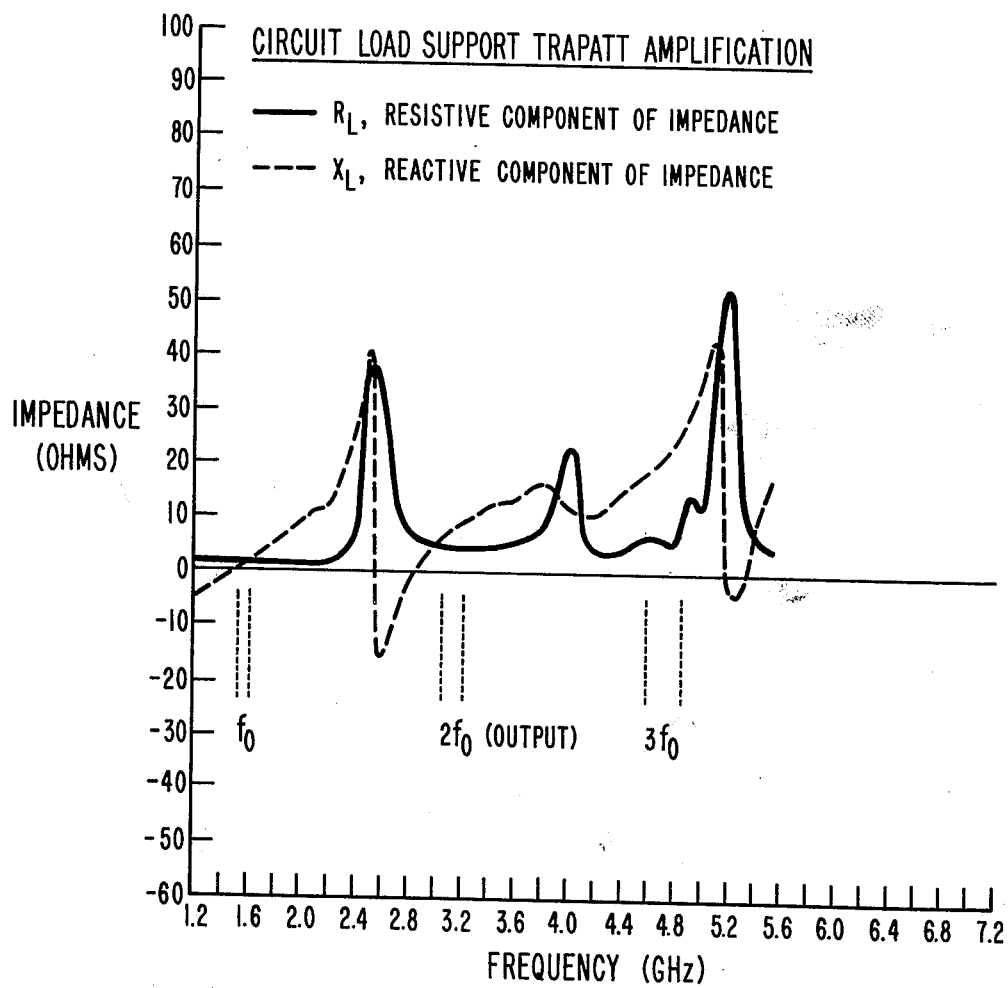
FIG. 3 is a graph showing impedance frequency measurements taken of a TRAPATT amplifier.

In accordance with the invention, a microwave apparatus is provided which has power extracted only at the second harmonic frequency. It has been found by circuit impedance measurements taken of a TRAPATT amplifier as shown in FIG. 3 that for power extraction at the second harmonic frequency, the diode requires a resistive loading at the second harmonic frequency, a low impedance loading at the fundamental frequency and an impedance at the third harmonic frequency which is greater than the impedance at the second harmonic. As illustrated in FIG. 3, the solid curve represents the resistive component of the impedance provided by the output means, as will be described subsequently, the resistive component being near zero at the fundamental frequency ($f_o$) and relatively low in the region of the second harmonic ($2f_o$) and third harmonic ($3f_o$) frequencies, respectively. The dashed curve represents the reactive component provided by the idler circuit. In the region, $f_o$, of the fundamental frequency, the impedance loading, which is the combination of the resistive and reactive components, is approximately equal to zero. In the region, $3f_o$, of the third harmonic frequency, the impedance loading is higher than the impedance at the second harmonic. According to the measurements, when the impedance at the third harmonic frequency is at least five times as great as the impedance at the second harmonic, and the impedance at the fundamental frequency is approximately zero, the impedance loading conditions are ideal for power extractions at the second harmonic frequency. This combination of impedances at the fundamental and third harmonic frequencies cannot be obtained with a quarter wavelength microstrip idler circuit since such a circuit provides a zero reactive impedance at the fundamental and the third harmonic frequency simultaneously. For the lumped element idler circuit, the tuning rate of change of the third harmonic impedance is very fast and therefore a controlled frequency shift is difficult to obtain. Additional tuning is required with both the quarter wavelength microstrip idlers and purely lumped element prior art circuits to increase the impedance at the third harmonic.

According to the present invention, the "hybrid" idler circuit 16, as illustrated in FIG. 2, comprising a distributed transmission line 18 and a lumped variable capacitor 20, provides a low reactive input impedance component at the fundamental frequency and a high reactive input impedance component at the third harmonic. The idler is a "hybrid" circuit since it comprises a distributed microstrip section in combination with a lumped capacitive element. The impedance response of the distributed microstrip line as known in the art is a function of the tangent of the frequency and the impedance response of the lumped capacitance is an inverse function of the frequency. The input impedance response of the hybrid idler circuit can be expressed as follows:

$$Z_{in} = Z_o \left[ \frac{Z_c \cos\beta l_1 + jZ_o \sin\beta l_1}{Z_o \cos\beta l_1 + jZ_c \sin\beta l_1} \right] \quad (1)$$

where $Z_o$ is the characteristic impedance of the distributed transmission line 18, $Z_o$ being a function of the width of the transmission line and the thickness of a dielectric substrate on which it is generally mounted. The length, $l_1$, is the length of the distributed transmission line 18 as shown in FIGS. 1 and 2. The impedance of the lumped variable capacitor, $Z_c$, is expressed as:

$$Z_c = -j\frac{1}{\omega C} \quad (2)$$

where ω is the angular frequency of the circuit and C is the capacitance of the variable capacitor 20. β is a wave propagation constant which is equal to $2\pi/\lambda$ where λ is the guided wavelength of the propagated wave. The different rates of response of impedance of the distributed transmission line and variable lumped capacitor combine to produce the low reactive input impedance at the fundamental frequency and the high reactive input impedance at the third harmonic.

By changing the capacitance of variable capacitor 20, the idler circuit input impedance is varied and the amplifier is tuned. These idler circuit changes affect mainly the reactive component of the impedance loading and the reactive component curve as shown in FIG. 3 is shifted horizontally as capacitive changes are made in the idler circuit variable capacitor 20. However, a low reactive component at the adjusted fundamental frequency and a high reactive component at the shifted third harmonic frequency still exist. Since the resistive component remains nearly constant within the tunable frequency range during idler circuit adjustments, the impedance loading conditions at the tunable fundamental and third harmonic frequencies are thus substantially the same as at the initial frequencies. Therefore, power may be extracted at the second harmonic frequency over the entire frequency tunable range at conditions that are suitable for a TRAPATT amplifier.

Referring back now to FIG. 1, the output means is preferably a coupled-bar transformer 22 which is electrically connected to transmission line 10 and thereby to diode D and is arranged to provide for transmission of a signal component at the second harmonic frequency to a terminating load impedance, typically 50 ohms (not shown). Coupled-bar transformer 22 comprises center conductor 24, which is electrically connected to transmission line 10 on one end and open at the other end. Capacitively coupled to center conductor 24 is center conductor 26. The end of center conductor 26 adjacent to the open-circuited end of center conductor 24 is connected to ground. Center conductor 26 has an electrical length $l_2$, which is selected to transmit the input frequency. The characteristic impedance of center conductors 24 and 26, the magnitude of capacitive coupling between these center conductors, and the electrical length of center conductor 26 are designed to provide the diode D with the desirable resistive termination at the second harmonic of the fundamental frequency of operation.

A directional circulator 28, connected near the open end of center conductor 26, is preferably used to couple microwave energy from an external source (not shown) to the diode D. A pulsed or D.C. reverse bias signal from an external source (not shown) is applied across electrodes 12 and 14 of diode D through an $L_1C_1$ biasing circuit. The magnitude of the applied pulsed or D.C. bias signal is slightly less than the diode threshold voltage necessary for operation.

In operation, the applied microwave signal (RFin) combines with the applied pulsed or D.C. reverse bias voltage and triggers the diode D into the TRAPATT mode of operation, generating a microwave signal rich in harmonics. The second harmonic frequency is equal to the frequency of the applied microwave signal (RFin). Thus, the frequency of the applied microwave signal is equal to the desired output frequency (RFout).

Figure 4:
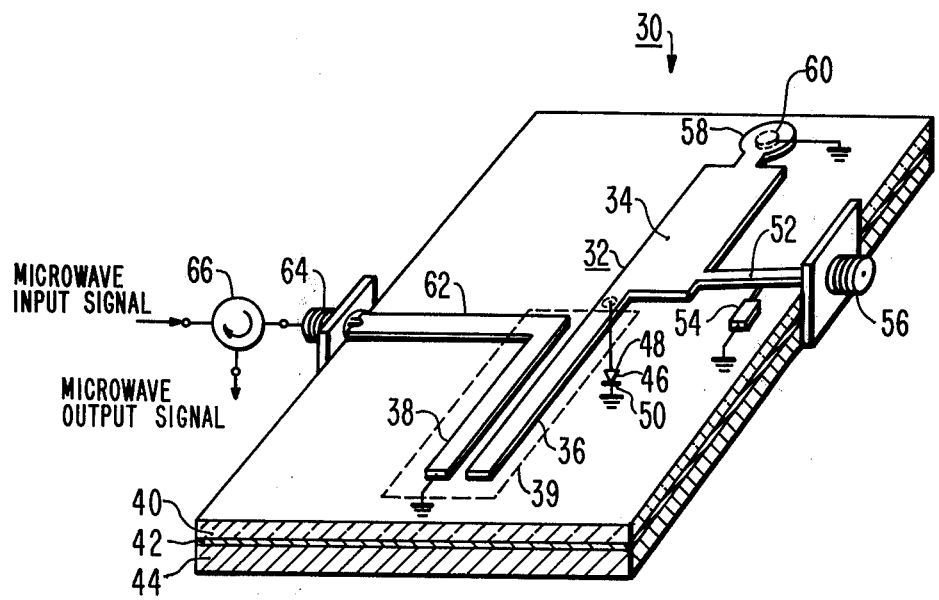
FIG. 4 is an isometric view of a microwave amplifier constructed according to the preferred form of the present invention shown in FIG. 1.

Referring to FIG. 4, there is shown in perspective a microwave amplifier 30 constructed according to the present invention. Transmission line 32, distributed transmission line 34 (corresponding to distributed transmission line 18) and center conductors 36 and 38 of a coupled-bar transformer 39 are microstrip lines suitably formed of conductive strips on the top surface of a dielectric substrate 40. The bottom surface of substrate 40 is bonded to a ground plane 44 preferably by a solder-bond 42. Mounted in transmission line 32 is a TRAPATT diode 46, shown schematically, having electrodes 48 and 50, electrode 50 being connected to ground. A bias lead line 52 defining an inductance ($L_1$) and a capacitor 54 having a capacitance ($C_1$), capacitor 54 being electrically connected to lead line 52, provide a bias circuit for applying a bias voltage across diode electrodes 48 and 50. Line 52 is connected to a bias connector 56 to apply the bias voltage from an external source, not shown. Electrically connected to distributed transmission line 34, as by contact pad 58, is a lumped variable capacitor 60, which is also connected to ground. Center conductor 38 of coupled bar transformer 39 is connected as by lead line 62 to a connector 64 coupled to a microwave signal. A directional circulator 66 is connected to connector 64 to apply the microwave signal to amplifier 30.

Measurements taken of the TRAPATT amplifier of FIG. 4 as described with power extracted at the second harmonic frequency indicate tunability over a wide range of frequencies. For the amplifier centered at 3 GHz, which is the second harmonic of a TRAPATT diode having a fundamental frequency of 1.5 GHz, the amplifier was tuned from 2.76 GHz to 3.52 GHz by adjusting the capacitance in the variable capacitor. This represents a bandwidth of 760 MHz, which is approximately two to three times the instantaneous bandwidths achieved by the prior art devices. This 760 MHz bandwidth constitutes a bandwidth of approximately 25% of the central frequency of operation.

It will now be appreciated that an amplifier utilizing a diode operating in the TRAPATT mode according to this invention is made to be frequency tunable by providing a hybrid idler circuit to establish the input impedance conditions required at the fundamental and third harmonic frequencies for extracting power at the second harmonic.. The impedance conditions provided by the hybrid idler circuit are derived from the combination of a distributed transmission line and a lumped variable capacitor and the interaction of their different impedance-frequency response rates. Changes in the capacitance of the variable capacitor tune the fundamental frequency and the second and third harmonics by varying the idler circuit input impedance without changing substantially the impedance conditions presented to the diode at the fundamental, second and third harmonic frequencies. In addition to providing tunability, and contrary to many prior art devices, the idler circuit is structurally independent of the output transformer which structural independence prevents undesirable distortions in the impedance matching circuit.

Although the preferred embodiment of the present invention has been described as a microwave amplifier as shown in FIGS. 1 and 4, it may also be operated as a microwave oscillator. There are two major differences between the operation of an oscillator and the amplifier mode of operation as previously described. First, the circulator is not used for an oscillator, since microwave energy from an external source is not required. Second, the magnitude of the pulsed or D.C. reverse bias voltage applied to the diode D for an oscillator is equal to or greater than the threshold voltage required to trigger the diode into generating microwave energy in the TRAPATT mode of operation. Otherwise, the method of extracting energy at the second harmonic frequency is the same for both devices.

What is claimed is:

1. A broad-band frequency tunable microwave apparatus of the type including a transmission line, a semiconductor element in said line for generating, in response to a threshold signal, a microwave signal having fundamental, second and third harmonically related frequency components, means for applying said threshold signal to said semiconductor element, and output means to provide a substantially resistive impedance electrically connected to said semiconductor element for transmitting a signal component at the second harmonic frequency to a terminating load impedance, wherein the improvement comprises:

a variable input impedance idler circuit connected in parallel with said semiconductor element including a distributed transmission line having a predetermined characteristic impedance serially connected to a lumped variable capacitor connected to ground, said input impedance of said idler circuit being substantially reactive and determining the fundamental and harmonic frequencies of said apparatus, said fundamental frequency and its harmonics being tunable over a selected frequency range by changing the input circuit impedance of said idler circuit by varying the capacitance of said variable capacitor, whereby said apparatus provides said microwave signal to said terminating load impedance only at said second harmonic frequency throughout the tunable frequency range.

2. A broad-band frequency tunable microwave apparatus according to claim 1, wherein the impedance loading at the third harmonic frequency is at least five times the impedance loading at the second harmonic frequency.

3. A broad-band frequency tunable microwave apparatus according to claim 1, wherein said semiconductor element is a diode adapted to operate in the TRAPATT mode.

4. A broad-band frequency tunable microwave apparatus according to claim 3, wherein said threshold signal comprises a pulsed or D.C. reverse bias voltage which exceeds a predetermined threshold value whereby said diode is triggered into said TRAPATT mode of operation.

5. A broad-band frequency tunable microwave apparatus according to claim 3, wherein said threshold signal is the sum of a pulsed or D.C. reverse bias voltage, having a magnitude less than a predetermined threshold value, and an RF voltage of an applied microwave input signal, said sum having a magnitude exceeding said threshold value whereby said diode is triggered into amplifying said microwave input signal.

6. A broad-band frequency tunable microwave apparatus according to claim 1, wherein said output means comprises an output impedance matching transformer.

7. A broad-band frequency tunable microwave apparatus according to claim 6, wherein said output impedance matching transformer comprises a coupled-bar transformer.

8. A broad-band frequency tunable microwave apparatus according to claim 1, wherein said transmission line, said output means, and said distributed transmission line are microstrip transmission lines.

* * * * *